(12) United States Patent
Shen et al.

(10) Patent No.: US 10,340,230 B1
(45) Date of Patent: Jul. 2, 2019

(54) SEMICONDUCTOR CHIP

(71) Applicant: United Microelectronics Corp., Hsinchu (TW)

(72) Inventors: Tsong-Lin Shen, Kaohsiung (TW); Chen-Hsiao Wang, Hsinchu (TW); Sheng-Wei Hung, Taipei (TW); Chin-Tsai Chang, Tainan (TW); Hui-Lung Chou, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/847,567

(22) Filed: Dec. 19, 2017

(51) Int. Cl.
*H01L 23/528* (2006.01)
*H01L 23/00* (2006.01)
*H01L 23/532* (2006.01)

(52) U.S. Cl.
CPC .......... *H01L 23/562* (2013.01); *H01L 23/528* (2013.01); *H01L 23/5329* (2013.01); *H01L 24/05* (2013.01); *H01L 24/13* (2013.01); *H01L 2224/02381* (2013.01); *H01L 2224/0401* (2013.01)

(58) Field of Classification Search
None
See application file for complete search history.

(56) References Cited

U.S. PATENT DOCUMENTS

| 7,968,976 | B2 | 6/2011 | Chang et al. | |
|---|---|---|---|---|
| 9,099,485 | B2 | 8/2015 | Yu et al. | |
| 9,559,063 | B2* | 1/2017 | Watanabe | H01L 23/562 |
| 9,837,366 | B1* | 12/2017 | Liu | H01L 23/585 |
| 2008/0191205 | A1* | 8/2008 | Tsai | H01L 22/34 257/48 |
| 2012/0241917 | A1* | 9/2012 | Ide | H01L 23/481 257/622 |
| 2017/0317037 | A1* | 11/2017 | Ling | H01L 23/585 |

* cited by examiner

*Primary Examiner* — Dung A. Le
(74) *Attorney, Agent, or Firm* — J.C. Patents

(57) ABSTRACT

A semiconductor chip is provided. The semiconductor chip includes at least one interlayer dielectric layer, a transmission pattern and a stress absorption structure. The at least one interlayer dielectric layer is disposed on a substrate. The transmission pattern is disposed on the at least one interlayer dielectric layer and within a peripheral region of the semiconductor chip. The transmission pattern is electrically connected to an external signal source. The stress absorption structure is disposed in the at least one interlayer dielectric layer within the peripheral region, and electrically connected to the transmission pattern. The stress absorption structure is covered by the transmission pattern.

20 Claims, 3 Drawing Sheets

SEMICONDUCTOR CHIP

BACKGROUND

Technical Field

The present invention generally relates to a semiconductor chip, and particularly relates to a system-on-chip (SoC).

Description of Related Art

A system-on-chip (SoC) is a microchip with all the necessary electronic circuits and parts for a given system, such as a smartphone or wearable computer. For instance, the SoC integrates a logic circuit and an antenna on a single chip. Since all the components are integrated on the same chip and internally connected, the power consumption is significantly decreased.

The antenna is generally disposed at a peripheral region of the chip, whereas a logic circuit is generally disposed in a central region of the chip. A wafer bumping process including a patterning process and a curing process on polymer layers covering the antenna are required to electrically connect the antenna to an external signal source. Thermal or mechanical actions during wafer manufacturing process (e.g., the wafer bumping process) as well as thermal cycles during a highly accelerated test often result in huge stress. The huge stress often causes delamination of the interlayer dielectric layers disposed below the antenna.

SUMMARY

Accordingly, the present invention is directed to a semiconductor chip avoided from a delamination problem on the interlayer dielectric layers within a peripheral region of the semiconductor chip.

A semiconductor chip of some embodiments in the present invention includes at least one interlayer dielectric layer, a transmission pattern and a stress absorption structure. The at least one interlayer dielectric layer is disposed on a substrate. The transmission pattern is disposed on the at least one interlayer dielectric layer and within a peripheral region of the semiconductor chip. The transmission pattern is electrically connected to an external signal source. The stress absorption structure is disposed in the at least one interlayer dielectric layer within the peripheral region, and electrically connected to the transmission pattern. The stress absorption structure is covered by the transmission pattern.

According to some embodiments, the semiconductor chip may further include a seal ring structure. The seal ring structure is disposed in the at least one interlayer dielectric layer, and isolated from the transmission pattern. The transmission pattern and the stress absorption structure are disposed at a side of the seal ring structure away from an edge of the semiconductor chip.

According to some embodiments, the semiconductor chip may further include a passivation layer, at least one polymer layer, a conductive structure and a bump. The passivation layer is disposed on the transmission pattern. The at least one polymer layer is disposed on the passivation layer. The conductive structure is disposed in the at least one polymer layer, and electrically connected with the transmission pattern. The bump is disposed on the conductive structure, and electrically connected with the conductive structure.

According to some embodiments, a material of the at least one polymer may include polyimide, polybenzoxazole, benzocyclobuten, silicones, acrylates, epoxy or a combination thereof.

According to some embodiments, the stress absorption structure may be disposed between the bump and an edge of the semiconductor chip.

According to some embodiments, a shortest distance from the bump to the edge of the semiconductor chip may be less than 20 μm.

According to some embodiments, the stress absorption structure may include a conductive pattern and a contact via. The conductive pattern is disposed in the at least one interlayer dielectric layer. The contact via is disposed in the at least one interlayer dielectric and over the conductive pattern. The conductive via is electrically connected between the transmission pattern and the conductive pattern.

According to some embodiments, an area of the conductive pattern may be ranged from 16 μm$^2$ to 144 μm$^2$.

According to some embodiments, a shape of the conductive pattern in a top view may include a rectangular shape, a circular shape or a polygonal shape.

According to some embodiments, the transmission pattern may have a linear portion. The linear portion includes at least one transmission line.

According to some embodiments, a number of the at least one transmission line may be plural, and a distance between adjacent transmission lines may be ranged from 2 μm to 120 μm.

According to some embodiments, a shortest distance between adjacent stress absorption structures may be ranged from 2 μm to 100 μm.

According to some embodiments, the semiconductor chip may further include an interconnection structure. The interconnection structure is disposed in the at least one interlayer dielectric layer within a logic region of the semiconductor chip. The interconnection structure is not extended into the peripheral region.

According to some embodiments, a bottom surface of the stress absorption structure and a bottom surface of a top conductive line of the interconnection structure may be at the same horizontal level.

A semiconductor chip of some embodiments in the present invention includes at least one interlayer dielectric layer, a transmission pattern and a stress absorption structure. The at least one interlayer dielectric layer is disposed on a substrate. The transmission pattern is disposed on the at least one interlayer dielectric layer and within a peripheral region of the semiconductor chip. The transmission pattern is electrically connected to an external signal source, and the transmission pattern has a linear portion extending along a first direction. The stress absorption structure is disposed in the at least one interlayer dielectric layer within the peripheral region. The stress absorption structure is electrically connected to the transmission pattern, and the stress absorption structure extends along a second direction and intersects with the linear portion of the transmission pattern.

According to some embodiments, the linear portion may include a plurality of transmission lines.

According to some embodiments, the stress absorption structure may not intersect with more than one of the plurality of transmission lines.

According to some embodiments, a length of the stress absorption structure along the second direction may be ranged from 4 μm to 22 μm.

As above, the stress absorption structure is disposed in the interlayer dielectric layers within the peripheral region of the semiconductor chip. Thereby, a stress generated on the interlayer dielectric layers during patterning and curing processes performed on the polymer layers disposed on the interlayer dielectric layers can be absorbed by the stress absorption structure. Therefore, a delamination problem of the interlayer dielectric layers within the peripheral region of the semiconductor chip can be avoided. Moreover, since the stress absorption structure is electrically connected to the transmission pattern, impedance matching of the transmission pattern can be performed by adjusting the size and shape of the stress absorption structure. As a result, a transmission efficiency of the transmission pattern can be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
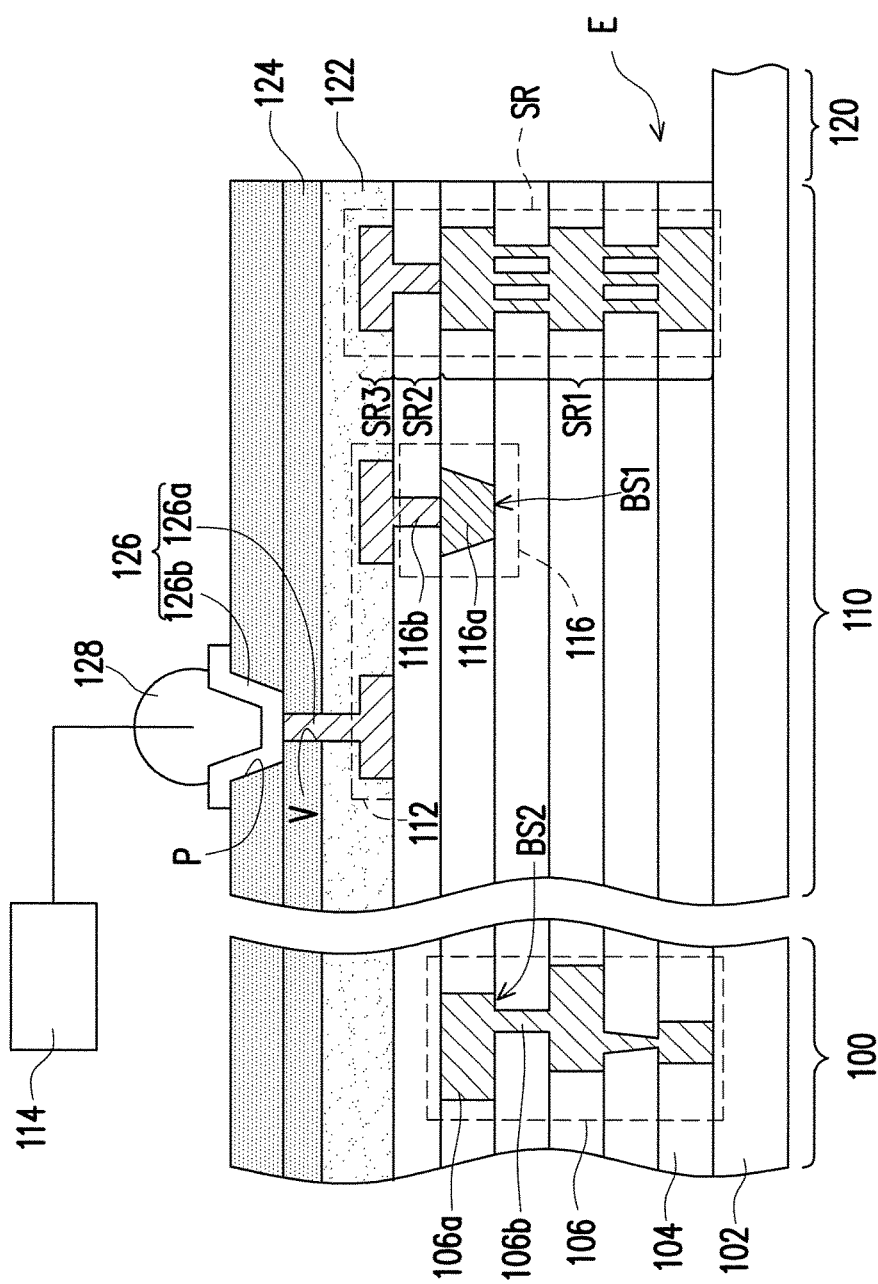
FIG. 1 is a cross-sectional view of a semiconductor chip according to some embodiments of the present invention.

FIG. 1 is a cross-sectional view of a semiconductor chip 10 according to some embodiments of the present invention.

Referring to FIG. 1, the semiconductor chip 10 may be a system-on-chip (SoC), which integrates a logic function and a transmission function on a single chip. The semiconductor 10 has a central region 100, a peripheral region 110 and a scribe line region 120. The central region 100 is also known as a logic region that includes a logic circuitry. The peripheral region 110 is configured to contain the transmission function, and may surround the central region 100. The scribe line region 120 is located at an edge E of the semiconductor chip 10.

The logic circuitry may include a plurality of logic devices (not shown) disposed in a substrate 102 within the central region 100. The substrate 102 may be a semiconductor wafer or a semiconductor-on-insulator (SOI) wafer. The semiconductor wafer or the SOI wafer contains a semiconductor material, which may include an elemental semiconductor material or a compound semiconductor material. For instance, the elemental semiconductor material may include silicon or germanium. The compound semiconductor material may include silicon germanium, silicon carbide, gallium arsenide, indium arsenide, gallium nitride or indium phosphide. The logic devices may include active devices and passive devices. For instance, the active devices may include diodes, transistors, memory devices or a combination thereof. The passive devices may include resistors, capacitors, inductors or a combination thereof.

At least one interlayer dielectric layer 104 is disposed on the substrate 102 within the central region 100 and the peripheral region 110. In the present embodiment, a number of the at least one interlayer dielectric layer 104 is plural. However, those skilled in the art may adjust the number of the dielectric layer 104 according to design requirement, the present invention is not limited thereto. In some embodiments, a material of the interlayer dielectric layers 104 may include an ultra-low dielectric constant material. For example, a dielectric constant of the ultra-low dielectric constant material is 2.5 to 2.7 or less. A material of the ultra-low dielectric constant material may include fluorinated silicate glass (e.g., Black Diamond (trademark of Applied Materials) and Coral (trademark of Novellus)), organic polymer material (e.g., SiLK (trademark of Dow Chemical), porous silicon oxide or a combination thereof.

The logic circuitry in the central region 100 may include an interconnection structure 106. The interconnection structure 106 is disposed in the interlayer dielectric layers 104 within the central region 100. In addition, the interconnection structure 106 may not be extended into the peripheral region 110, such that the interconnection structure 106 can be avoided from interfering the transmission function in the peripheral region 110. In some embodiments, the interconnection structure 106 may include conductive lines 106a and conductive vias 106b. Each conductive line 106a is disposed on one of the interlayer dielectric layers 104, so as to provide horizontal interconnection. Each conductive via 106b is disposed in one of the interlayer dielectric layers 104, so as to provide vertical interconnection. In some embodiments, a material of the interconnection structure 106 may include aluminum, copper or a combination thereof.

A transmission pattern 112 is disposed on the interlayer dielectric layers 104 within the peripheral region 110 of the semiconductor chip 10. In some embodiments, a material of the transmission pattern 112 may include aluminum, copper or a combination thereof. From a top view, a shape of the transmission pattern 112 may include a linear shape, a loop shape, a spiral shape, an inter-digital shape or so forth. Moreover, the transmission pattern 112 may be a single-layer structure or a multi-layers structure. Those skilled in the art may adjust the material, shape or structure of the transmission pattern 112, the present invention is not limited thereto. The transmission pattern 106 is electrically connected to an external signal source 114 or a plurality of external sources 114. In some embodiments, the transmission pattern 112 may be served as an antenna, such that the transmission pattern 112 can transmit signals from the external signal source(s) 114. Therefore, the transmission function in the peripheral region 110 can be realized via utilizing the transmission pattern 112. In some embodiments, the transmission pattern 112 may be a radio frequency (RF) antenna, and the external signal source(s) 114 may be a RF signal source. For example, a frequency of the external signal source(s) 114 may be (but not limited to) 2 GHz or 5 GHz. In alternative embodiments, the transmission pattern 112 may be served as an impedance matching structure.

The semiconductor chip 10 further includes a stress absorption structure 116. The stress absorption structure 116 is disposed in the interlayer dielectric layers 104 within the peripheral region 110. In addition, the stress absorption structure 116 is electrically connected to the transmission pattern 112, and is covered by the transmission pattern 112. In some embodiments, the stress absorption structure 116 may be completely covered by the transmission pattern 112. In alternative embodiments, the transmission pattern 112 may expose at least a part of the stress absorption structure 116. The stress absorption structure 116 is able to absorb a stress generated on the interlayer dielectric layers 104 within the peripheral region 110. The stress may be generated during a patterning process and a curing process sequentially performed on polymer layers 124 covering the transmission pattern 112 for forming inputs/outputs (I/Os) of the transmission pattern 112. By disposing the stress absorption structure 116 to absorb the stress generated on the interlayer dielectric layers 104, a delamination problem of the interlayer dielectric layers 104 can be avoided. Furthermore, since the stress absorption structure 116 is electrically connected with the transmission pattern 112, impedance matching of the transmission pattern 112 may be performed through adjusting a size and a shape of the stress absorption structure 116. In some embodiments, one end of the stress absorption structure 116 is electrically connected with the transmission pattern 112, and the other end of the stress absorption structure 116 is floated (e.g., isolated from the logic circuitry in the central region 100). In other words, the stress absorption structure 116 may be one-end-floated.

In some embodiments, the stress absorption structure 116 may include a conductive pattern 116a and a contact via 116b. The conductive pattern 116a and the contact via 116b are disposed in the interlayer dielectric layers 104. In addition, the contact via 116b is disposed over the conductive pattern 116a, such that the contact via 116b is electrically connected between the transmission pattern 112 and the conductive pattern 116a. In some embodiments, the contact via 116b may be disposed in the topmost layer of the interlayer dielectric layers 104, and the conductive pattern 116a may be disposed in the second topmost layer of the interlayer dielectric layers 104. In some embodiments, the conductive pattern 116a in the peripheral region 110 and a top layer of the conductive lines 106a in the central region 100 may be disposed in the same interlayer dielectric layer 104, such as the second topmost layer of the interlayer dielectric layers 104. In other words, a bottom surface BS1 of the stress absorption structure 116 and a bottom surface BS2 of the top layer of the conductive lines 106a may be at the same horizontal level. In addition, the conductive pattern 116a in the peripheral region 110 and the top layer of the conductive lines 106a in the central region 100 may be formed in the same manufacturing step, and thus formed by the same material. In some embodiments, an area of the conductive pattern 116a may be ranged from 16 $\mu m^2$ to 144 $\mu m^2$. From a top view, a shape of the conductive pattern 116a may include a rectangular shape, a circular shape or a polygonal shape.

In some embodiments, the semiconductor chip 10 may further include a passivation layer 122, at least one polymer layer 124, a conductive structure 126 and a bump 128. The passivation layer 122 is disposed on the transmission pattern 112. In some embodiments, a material of the passivation layer 122 may include silicon nitride, silicon oxide, silicon oxynitride or so forth. The at least one polymer layer 124 is disposed on the passivation layer 122. In the present embodiments, a number of the at least one polymer layer 124 is plural. Those skilled in the art may adjust the number of the at least one polymer layer 124 according to design requirement, the present invention is not limited thereto. In some embodiments, a material of the polymer layers 124 may include polyimide, polybenzoxazole, benzocyclobuten, silicones, acrylates, epoxy or a combination thereof.

The conductive structure 126 is disposed in the polymer layers 124, and is electrically connected between the transmission pattern 112 and the bump 128. In some embodiments, the conductive structure 126 may extend onto a top surface of the polymer layers 124, and may extend down into the passivation layer 122. In some embodiments, the conductive structure 126 may include a redistribution structure 126a and a under bump metal (UBM) layer 126b. The redistribution structure 126a is disposed in the polymer layers 124, and may extend down into the passivation layer 122. In addition, the redistribution structure 126a is electrically connected between the UBM layer 126b and the transmission pattern 112. The redistribution structure 126a shown in FIG. 1 is disposed in a single polymer layer 124. In other embodiments, the redistribution structure 126a may be disposed in multiple polymer layers 124. The redistribution structure 126a and the transmission pattern 112 may be formed by the same material, or may be formed by different materials. For example, a material of the redistribution structure 126a may include aluminum, copper or a combination thereof. The UBM layer 126b is disposed on the redistribution structure 126a, and may extend onto the top surface of the polymer layers 124. In some embodiments, a material of the UBM layer 126b may include titanium, tungsten, copper, nickel, chromium or a combination thereof.

The bump 128 is disposed on the conductive structure 126. In some embodiments, the stress absorption structure 116 may be disposed between the bump 128 and an edge E of the semiconductor chip 10. For example, a shortest distance from the bump 128 to the edge E of the semiconductor chip 10 is less than 20 μm. The bump 128 may be served as an input/output (110) of the transmission pattern 112. That is, the bump 128 may be electrically connected between the transmission pattern 112 and the external signal source(s) 114. In some embodiments, a material of the bump 128 may include lead, tin, silver, copper, bismuth, gold or a combination thereof.

A patterning process and a curing process may be sequentially performed on the polymer layers 124, so as to form a via V and an opening P in the polymer layers 124. The via V and the opening P can accommodate the conductive structure 126 and the bump 128. In some embodiments, the via V is filled by the redistribution structure 126a, and the UBM layer 126b is disposed in the opening P. Since the stress absorption structure 116 is disposed to absorb the stress generated on the interlayer dielectric layers 104 during the patterning process and the curing process, a delamination problem of the interlayer dielectric layers 104 can be avoided.

In some embodiments, the semiconductor chip 10 may further include a seal ring structure SR. The seal ring structure SR is disposed in the interlayer dielectric layers 104 within the peripheral region 110. The seal ring structure SR may further extend into the passivation layer 122. The seal ring structure SR may include a first portion SR1, a second portion SR2 and a third portion SR3. The first portion SR1 is located below the topmost layer of the interlayer dielectric layers 104. Moreover, the first portion SR1 of the seal ring structure SR, the conductive pattern 116a of the stress absorption structure 116 and the interconnection structure 106 may be formed by the same material, and are formed in the same manufacturing steps. The second portion SR2 is located in the topmost layer of the interlayer dielectric layers 104, and may be formed by the same material as well the same manufacturing step with the contact via 116b of the stress absorption structure 116. The third portion SR3 is located in the passivation layer 122, and may be formed by the same material as well the same manufacturing step with the transmission pattern 112. In addition, the seal ring structure SR is located relatively close to the scribe line region 120 than the transmission pattern 112 and the stress absorption structure 116, so as to protect the transmission pattern 112 and the stress absorption structure 116 from the damage caused by a singulation process performed along the scribe line region 120. In other words, the transmission pattern 112 and the stress absorption structure 116 are located at a side of the seal ring structure SR away from the edge E of the semiconductor chip 10. Furthermore, the seal ring structure SR is isolated from the transmission pattern 112 in the peripheral region 110 and the logic circuitry in the central region 100.

Figure 2:
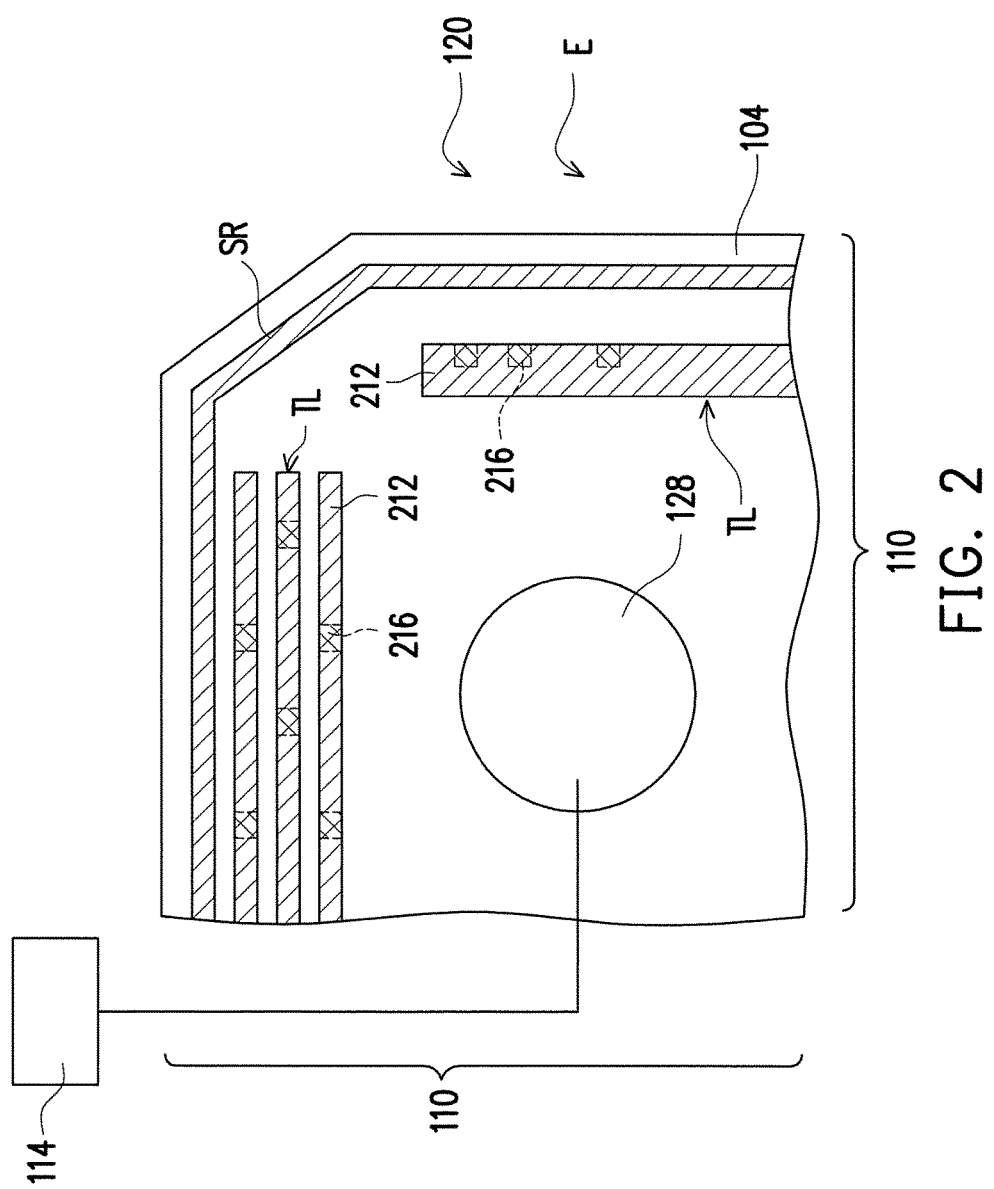
FIG. 2 is a top-view of a semiconductor chip according to some embodiments of the present invention.

FIG. 2 is a top-view of a semiconductor chip 20 according to some embodiments of the present invention. The semiconductor chip 20 is similar to the semiconductor chip 10 shown in FIG. 1, only differences lay in between will be discussed, the same or the like parts will not be repeated again. In addition, the same or like symbols are referred to the same or like elements.

Referring to FIG. 2, a transmission pattern 212 may have a linear portion, which includes at least one transmission line TL. The at least one transmission line TL may be a straight line or a curved line. In some embodiments, a number of the at least one transmission line TL may be plural. Those skilled in the art may adjust the number of the at least one transmission line TL according to design requirement, the present invention is not limited thereto. In some embodiments, the transmission lines TL are spaced apart from each other. For example, a distance between adjacent transmission lines TL may be ranged from 2 μm to 120 μm.

In the present embodiment, a number of a stress absorption structure 216 is plural. In addition, the stress absorption structures 216 are covered by the transmission lines TL, and electrically connected to the transmission lines TL. The stress absorption structures 216 may be spaced apart from each other. For example, a shortest distance between adjacent stress absorption structures 216 may be ranged from 2 μm to 100 μm. It should be noted that the contact vias of the absorption structures 216 are omitted in FIG. 2. That is, the absorption structures 216 illustrated in FIG. 2 appear to be the conductive patterns of the absorption structures 216. From a top view, each stress absorption structure 216 (the conductive pattern of the stress absorption structure 216) is in a rectangular shape, but the present invention is not limited thereto. Furthermore, the central region, the passivation layer, the polymer layers and the conductive structure are also omitted in FIG. 2 for concise purpose.

Figure 3:
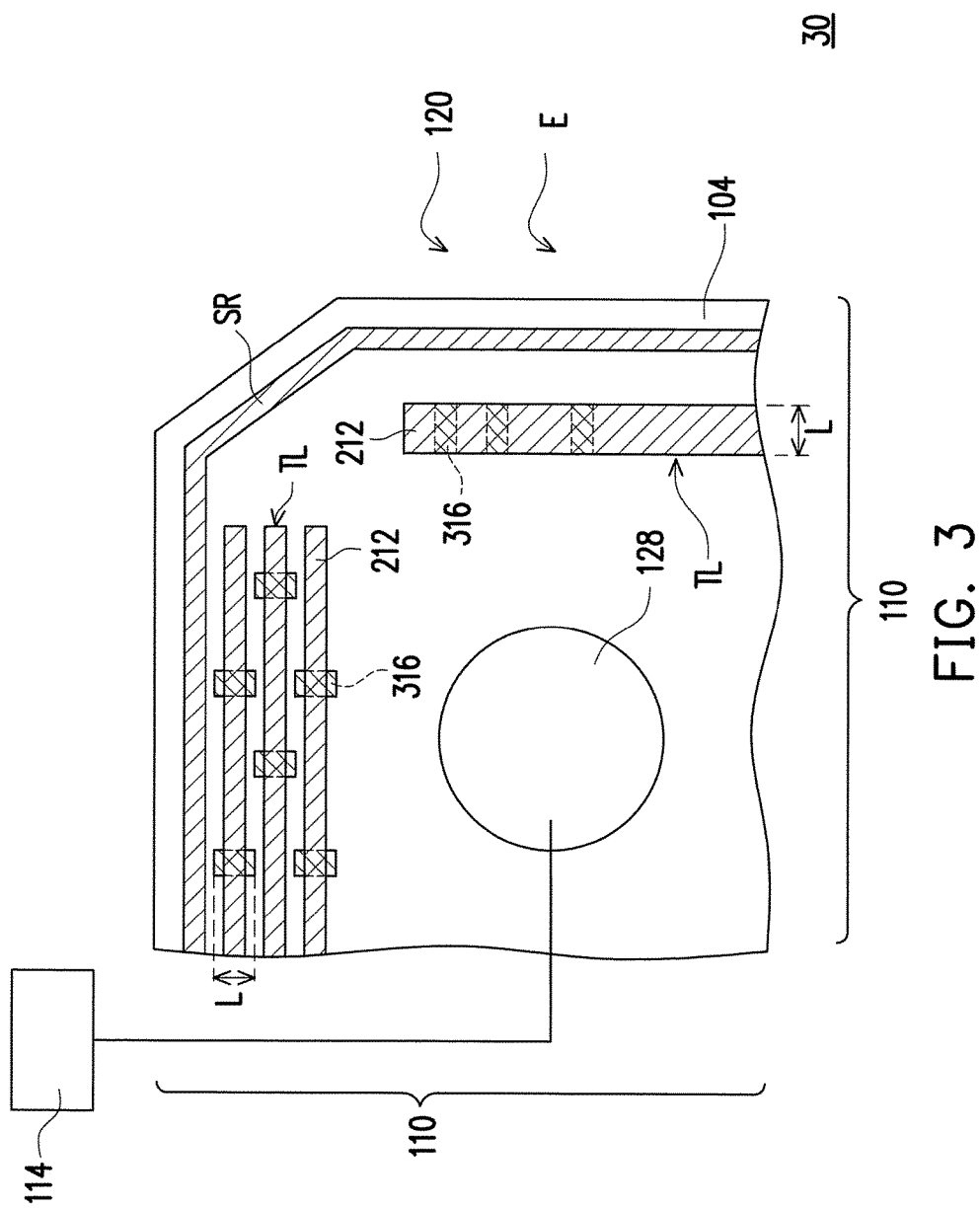
FIG. 3 is a top-view of a semiconductor chip according to alternative embodiments of the present invention.

FIG. 3, is a top-view of a semiconductor chip 30 according to alternative embodiments of the present invention. The semiconductor chip 30 is similar to the semiconductor chip 20 shown in FIG. 2, only differences lay in between will be discussed, the same or the like parts will not be repeated again. In addition, the same or like symbols are referred to the same or like elements.

Referring to FIG. 3, each of stress absorption structures 316 is in a linear shape. The transmission lines TL of the linear portion of the transmission pattern 212 are extended along a first direction, whereas the stress absorption structures 316 are extended along a second direction. The first direction is intersected with the second direction. In some embodiments, the first direction is normal to the second direction. In other words, the extending direction of the absorption structures 316 are intersected with or normal to the extending direction of linear portion of the transmission pattern 212. In some embodiments, each of the stress absorption structures 316 does not intersect with more than one of the transmission lines TL. In other words, each of the stress absorption structures 316 may not bridge two or more of the transmission lines TL. In some embodiments, a length L of each stress absorption structure 316 along the second direction may be ranged from 4 μm to 22 μm. In the present embodiment, some of the stress absorption structures 316 are completely covered by the transmission lines TL, whereas the others of the stress absorption structures 316 are partially exposed by the transmission lines TL. Those skilled in the art may adjust the areas of the transmission lines TL and stress absorption structures 316, such that the stress absorption structures 316 may be completely or partially covered by the transmission lines TL. The present invention does not intend to impose a limitation on this regard.

In view of above, the stress absorption structure is disposed in the interlayer dielectric layers within the peripheral region of the semiconductor chip. Thereby, the stress generated on the interlayer dielectric layers during the thermal or mechanical actions in the wafer fabrication process can be absorbed by the stress absorption structure. Therefore, a delamination problem of the interlayer dielectric layers within the peripheral region of the semiconductor chip can be avoided. Moreover, since the stress absorption structure is electrically connected to the transmission pattern, impedance matching of the transmission pattern can be performed by adjusting the size and shape of the stress absorption structure. As a result, a transmission efficiency of the transmission pattern can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor chip, comprising:
   at least one interlayer dielectric layer, disposed on a substrate;
   a transmission pattern, disposed on the at least one interlayer dielectric layer and within a peripheral region of the semiconductor chip, wherein the transmission pattern is electrically connected to an external signal source;
   a stress absorption structure, disposed in the at least one interlayer dielectric layer within the peripheral region, and electrically connected to the transmission pattern, wherein the stress absorption structure is covered by the transmission pattern.

2. The semiconductor chip according to claim 1, further comprising:
   a seal ring structure, disposed in the at least one interlayer dielectric layer, and isolated from the transmission pattern, wherein the transmission pattern and the stress absorption structure are disposed at a side of the seal ring structure away from an edge of the semiconductor chip.

3. The semiconductor chip according to claim 1, further comprising:
   a passivation layer, disposed on the transmission pattern;
   at least one polymer layer, disposed on the passivation layer;
   a conductive structure, disposed in the at least one polymer layer, and electrically connected with the transmission pattern; and
   a bump, disposed on the conductive structure, and electrically connected with the conductive structure.

4. The semiconductor chip according to claim 3, wherein a material of the at least one polymer comprises polyimide, polybenzoxazole, benzocyclobuten, silicones, acrylates, epoxy or a combination thereof.

5. The semiconductor chip according to claim 4, wherein the stress absorption structure is disposed between the bump and an edge of the semiconductor chip.

6. The semiconductor chip according to claim 5, wherein a shortest distance from the bump to the edge of the semiconductor chip is less than 20 μm.

7. The semiconductor chip according to claim 1, wherein the stress absorption structure comprises:
- a conductive pattern, disposed in the at least one interlayer dielectric layer; and
- a contact via, disposed in the at least one interlayer dielectric and over the conductive pattern, wherein the conductive via is electrically connected between the transmission pattern and the conductive pattern.

8. The semiconductor chip according to claim 7, wherein an area of the conductive pattern is ranged from 16 µm² to 144 µm².

9. The semiconductor chip according to claim 7, wherein a shape of the conductive pattern in a top view comprises a rectangular shape, a circular shape or a polygonal shape.

10. The semiconductor chip according to claim 1, wherein the transmission pattern has a linear portion, the linear portion comprises at least one transmission line.

11. The semiconductor chip according to claim 10, wherein a number of the at least one transmission line is plural, and a distance between adjacent transmission lines is ranged from 2 µm to 120 µm.

12. The semiconductor chip according to claim 10, wherein a number of the stress absorption structure is plural, the plurality of stress absorption structures are covered by the at least one transmission line and electrically connected to the at least one transmission line.

13. The semiconductor chip according to claim 12, wherein a shortest distance between adjacent stress absorption structures is ranged from 2 µm to 100 µm.

14. The semiconductor chip according to claim 1, further comprising:
- an interconnection structure, disposed in the at least one interlayer dielectric layer within a logic region of the semiconductor chip, wherein the interconnection structure is not extended into the peripheral region.

15. The semiconductor chip according to claim 14, wherein a bottom surface of the stress absorption structure and a bottom surface of a top conductive line of the interconnection structure are at the same horizontal level.

16. A semiconductor chip, comprising:
- at least one interlayer dielectric layer, disposed on a substrate;
- a transmission pattern, disposed on the at least one interlayer dielectric layer within a peripheral region of the semiconductor chip, wherein the transmission pattern is electrically connected to an external signal source, and the transmission pattern has a linear portion extending along a first direction; and
- a stress absorption structure, disposed in the at least one interlayer dielectric layer and within the peripheral region, wherein the stress absorption structure is electrically connected to the transmission pattern, and the stress absorption structure extends along a second direction and intersects with the linear portion of the transmission pattern.

17. The semiconductor chip according to claim 16, further comprising:
- a seal ring structure, disposed in the at least one interlayer dielectric layer, and isolated from the transmission pattern, wherein the stress absorption structure is disposed at a side of the seal ring structure away from an edge of the semiconductor chip.

18. The semiconductor chip according to claim 16, wherein the linear portion comprises a plurality of transmission lines.

19. The semiconductor chip according to claim 18, wherein the stress absorption structure does not intersect with more than one of the plurality of transmission lines.

20. The semiconductor chip according to claim 16, a length of the stress absorption structure along the second direction is ranged from 4 µm to 22 µm.

* * * * *